United States Patent
Coffey et al.

(10) Patent No.: US 10,399,177 B1
(45) Date of Patent: Sep. 3, 2019

(54) ENCLOSURES, DEVICES WITH A FRICTION STIR WELD, PRECURSORS THEREOF, AND RELATED METHODS

(71) Applicant: Seagate Technology LLC, Cupertino, CA (US)

(72) Inventors: Jerome Thomas Coffey, Boulder, CO (US); Samuel Edward Severson, Longmont, CO (US); David G. Fitzgerald, Lafayette, CO (US); Jeffrey L. Bruce, Longmont, CO (US); David R. Lapp, Boulder, CO (US); Darrel R. Culver, Longmont, CO (US)

(73) Assignee: SEAGATE TECHNOLOGY LLC, Cupertino, CA (US)

( * ) Notice: Subject to any disclaimer, the term of this patent is extended or adjusted under 35 U.S.C. 154(b) by 0 days.

(21) Appl. No.: 15/909,429

(22) Filed: Mar. 1, 2018

(51) Int. Cl.
| | |
|---|---|
| *G11B 33/02* | (2006.01) |
| *B23K 20/12* | (2006.01) |
| *H05K 5/04* | (2006.01) |
| *H05K 5/06* | (2006.01) |
| *H05K 5/03* | (2006.01) |
| *G11B 33/04* | (2006.01) |
| *B23K 101/36* | (2006.01) |

(52) U.S. Cl.
CPC ...... *B23K 20/1265* (2013.01); *B23K 20/1255* (2013.01); *G11B 33/022* (2013.01); *G11B 33/027* (2013.01); *G11B 33/0405* (2013.01); *H05K 5/03* (2013.01); *H05K 5/04* (2013.01); *H05K 5/066* (2013.01); *B23K 2101/36* (2018.08)

(58) Field of Classification Search
None
See application file for complete search history.

(56) References Cited

U.S. PATENT DOCUMENTS

| | | |
|---|---|---|
| 7,146,713 B1 | 12/2006 | Ying |
| 7,508,682 B2 | 3/2009 | Badarinarayan et al. |
| 8,016,179 B2 | 9/2011 | Burford |
| 8,279,552 B2 | 10/2012 | Stipe |
| 9,536,572 B2 | 1/2017 | Lapp et al. |
| 9,754,631 B2* | 9/2017 | Severson ........... G11B 33/1486 |
| 2003/0179489 A1* | 9/2003 | Bernett ............. G11B 33/1466 360/97.22 |
| 2005/0270690 A1 | 12/2005 | Gunderson |
| 2009/0237243 A1* | 9/2009 | Child ................... G06K 19/005 340/540 |
| 2012/0275054 A1 | 11/2012 | McGuire, Jr. et al. |
| 2017/0053679 A1* | 2/2017 | Albrecht ............. G11B 25/043 |
| 2019/0076956 A1* | 3/2019 | Coffey ................ B23K 20/129 |

* cited by examiner

*Primary Examiner* — William J Klimowicz
(74) *Attorney, Agent, or Firm* — Kagan Binder PLLC

(57) ABSTRACT

Described are enclosures that include a friction stir weld, including electronic device enclosures, and precursors thereof, that contain a base and a cover that in an assembled condition form a joint at which a friction stir weld can be produced, as well as methods for producing a friction stir weld at a joint of such an assembly.

19 Claims, 5 Drawing Sheets

ENCLOSURES, DEVICES WITH A FRICTION STIR WELD, PRECURSORS THEREOF, AND RELATED METHODS

FIELD

The invention relates to electronic devices that include a friction stir weld, and precursors of these devices such as electronic device enclosures that contain a base and a cover that in an assembled condition form a joint at which a friction stir weld can be produced, as well as methods for producing such a friction stir weld at such a joint.

BACKGROUND

Electronic devices such as data storage devices (e.g., hard disk drives or "HDDs"), solid state memories, microelectronic devices, and computers (e.g., personal computers, cell phones, tablets, laptops, etc.) perform essential functions in today's digital information-intensive world. As our reliance on these devices increases, so do the performance requirements of these devices, including their combined speed and reliability.

To increase reliability of certain types of advanced electronic devices, e.g., hard disk drives, these devices can be constructed to include an enclosure that is hermetically sealed, and that contains a non-air atmosphere, for example a low density atmosphere such as a concentrated helium atmosphere. There are various benefits to operating a hard disk drive in a low density atmosphere. As one benefit, a low density atmosphere can reduce the amount of drag force that affects a spinning disk or a stack of closely-spaced spinning disks. The reduced amount of drag can significantly reduce the amount of power required to cause a disk stack to spin. Also, a low density atmosphere can reduce the amount of unwanted, non-rotational movement or "flutter" that occurs in a spinning disk and a disk suspension during use. Reducing un-wanted motion of a disk or disk suspension can allow adjacent disks of a disk stack to be placed more closely together, which increases areal density (a measure of the quantity of information bits that can be stored on a given area of disk surface) by enabling a narrower data track pitch. Also advantageously, efficient thermal conduction of helium can allow for a reduced operating temperature of a device, and lower density gases (relative to air) can additionally produce less acoustic noise. The reliability of a hard disk drive that contains helium in a hermetically sealed enclosure can also be increased due to a reduced level of humidity at the drive interior, due to elimination of other gases and contaminants such as corrosive gases, and due to a reduced sensitivity of the atmosphere to altitude and external pressure variations.

An electronic device that is designed to be hermetically sealed must include an enclosure that can be assembled and hermetically sealed in a manner that effectively, efficiently, and reliably produces a long-lasting, high quality hermetic seal.

SUMMARY

Friction stir welding is a technique that is known to be useful in various applications for welding metals. See for example U.S. Pat. Nos. 8,016,179 and 9,536,572, the entireties of these documents being incorporated herein by reference. Friction stir welding techniques, however, are known to have limits, and are understood to be not necessarily effective or efficient for all situations where a weld between two separate metal components is required. Friction stir welding techniques can be most effectively and reliably used for welding together two metal components that each do not have too small of a thickness, for example two metal components that each have not too small of a thickness and that each have thicknesses that are somewhat similar. Friction stir welding techniques are not generally known to be reliably or successfully used for welding together two metal components that are relatively thin, or to weld together a first metal component having a relatively small thickness with a second metal component having a relatively larger thickness.

Applicant's research in the area of friction stir welding techniques has led to the identification of methods and devices that can be used to successfully weld, by friction stir welding methods, a metal base and a metal cover of an electronics enclosure such as an enclosure of a hard disk drive. Applicant's research, for example, has led to designs of useful and advantageous friction stir welding tools, useful and advantageous welding conditions and parameters, and useful and advantageous cover and base configurations.

As presented in the following description, Applicant has identified novel and inventive cover and base components of assemblies useful to prepare an enclosure welded with a friction stir weld. The components form opposing metal pieces of an enclosure assembly such as a cover and a base of an electronics enclosure. The base, cover, or both, include one or a combination of features that facilitate processing of the assembly by friction stir welding the assembly at a joint formed between edges of the two components. The components, assemblies (before and after friction stir welding), and related methods may be useful for producing electronics enclosures and electronic devices that include a friction stir weld.

An assembly as described includes a first metal component in the form of a base, and a second metal component in the form of a cover that can be placed over the base to form an enclosure or enclosure assembly. The enclosure includes a joint (i.e., an un-welded, pre-welded, joint) at a location where surfaces of the cover meet surfaces of the base, at a perimeter of the enclosure. The joint may be processed by friction stir welding to produce a friction stir weld at the joint to connect the base to the cover. The friction stir weld can function as a hermetic seal that effectively prevents air or other gases from entering or escaping the sealed interior of the enclosure, for example to maintain a low density atmosphere (a non-air atmosphere, such as helium) within the enclosure.

According to the present invention, Applicant has identified that various features of a base or cover of an enclosure can be important in producing a high quality friction stir welded at a joint formed between the base and the cover. The features may include one or more of a dimension, shape, or material of a cover or base, or a method of preparing a cover or a base. The one or more features can affect the manner in which the base engages and interacts with the cover at a location of formation of a friction stir weld, i.e., at the joint, in a manner that affects the quality of the weld. The feature can also affect the manner in which the base, the cover, and a friction stir weld, interact with other important structures of the enclosure or a device that includes the enclosure, including interior components such as one or more magnetic disks, electronic components, sealing gaskets, or other heat-sensitive items at the interior.

As a first example, various features of a structure of a base or a structure of a cover will affect the nature of a fit between the cover and the base during assembly of the cover and the base, before formation of a friction stir weld, when the cover is physically placed over the base. With the cover over the base, a joint is formed between a perimeter of the base and a perimeter of the cover, i.e., between a downward-extending lip of the cover and an exterior sidewall of the base. That fit between the cover and the base can affect the quality of a friction stir weld formed at the joint, as well as the efficiency of forming the assembly and the joint.

In one aspect, the invention relates to an enclosure that includes a cover and a metal base. The metal base includes: a horizontal bottom and a base cavity defined by the bottom and vertical base sidewalls at a base perimeter; and an outer sidewall surface extending along the base perimeter that includes a shoulder, an upper sidewall surface above the shoulder, and a lower sidewall surface below the shoulder. The shoulder includes a lower portion of the upper sidewall surface connecting to a horizontal shoulder surface at an interior shoulder corner, the horizontal shoulder surface extending horizontally from the interior shoulder corner to an exterior shoulder corner, and an upper portion of the lower sidewall surface extending vertically from the exterior shoulder corner. The cover can be located over the base to enclose the base cavity, and includes: a horizontal top portion extending over the base and a lip at a cover perimeter. The lip extends in a vertical direction relative to the horizontal top portion and includes a lower lip portion that contacts the shoulder when the cover is installed over the base. The enclosure includes an interference fit between the lower lip portion and the lower portion of the upper sidewall.

In another aspect the invention relates to a method of forming a friction stir weld on an enclosure. The enclosure includes a metal base and a cover. The metal base includes: a horizontal bottom and a base cavity defined by the bottom and vertical base sidewalls at a base perimeter; and an outer sidewall surface extending along the base perimeter that includes a shoulder, an upper sidewall surface above the shoulder, and a lower sidewall surface below the shoulder, the shoulder comprising a lower portion of the upper sidewall surface connecting to a horizontal shoulder surface at an interior shoulder corner, the horizontal shoulder surface extending horizontally from the interior shoulder corner to an exterior shoulder corner, and an upper portion of the lower sidewall surface extending vertically from the exterior shoulder corner. The cover can be located over the base to enclose the base cavity, and can include: a horizontal top portion extending over the base and a lip at a cover perimeter, the lip extending in a vertical direction relative to the horizontal top portion, the lip including a lower lip portion that contacts the shoulder to form a joint when the cover is installed over the base. The assembly includes an interference fit between the lower lip portion and the lower portion of the upper sidewall. The method includes contacting the joint with a rotating friction stir weld tool.

Figure 1A:
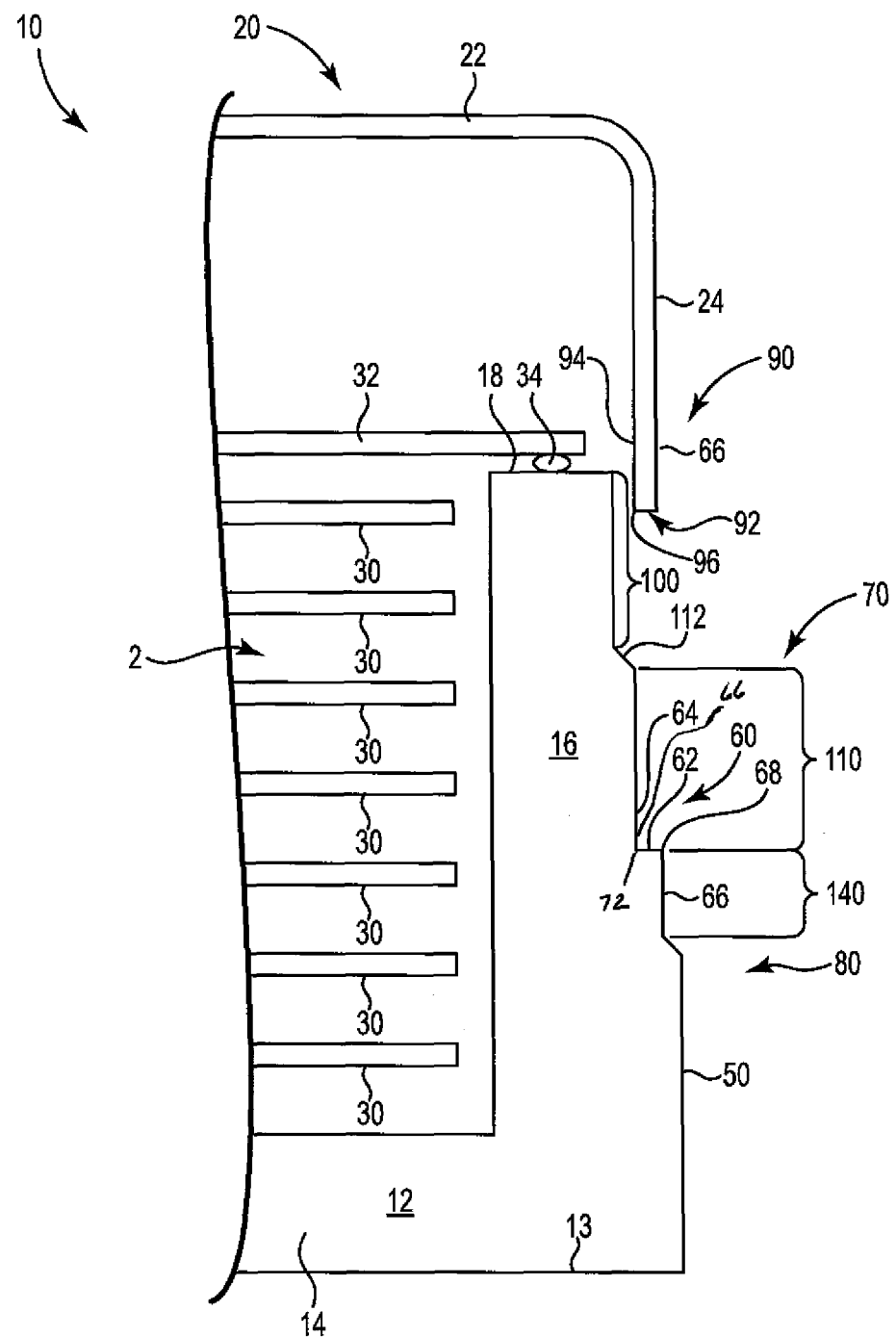
FIGS. 1A, 1B, and 1C illustrate features of assemblies as described, including a cover and a base.

All drawings are schematic and not to scale.

DETAILED DESCRIPTION

The invention relates to assemblies that include two metal components of an enclosure that is useful as part of an electronic device. The invention also relates to electronic devices prepared to include the enclosure, as well as related methods. The assemblies include two metal components referred to herein as a base and a cover, that can be placed adjacent to each other (in an opposed arrangement) in an assembled condition, and that when assembled contact each other at each of their respective perimeters to form an enclosure having an interior. Surfaces of the two metal components, at perimeters of each component, form a joint at which a friction stir weld can be produced to secure the two metal components together and form a hermetic seal around the perimeter of the completed assembly.

As contemplated by the Applicant, and as presented herein, the assembly may be in an assembled and pre-welded form, or in a posted-welded form. Specifically, an assembly may include the base and the cover assembled as an enclosure that includes a joint at a perimeter of the enclosure, wherein the base and cover are held together (removably) at the joint by contact and friction in the absence of (i.e., prior to forming) a friction stir weld. Alternately an assembly may be a welded or "post-welded" assembly of the base and cover after a friction stir weld has been formed at the joint.

The invention additionally relates to: the two metal components used to form the assembly, either individually or in combination; methods of assembling the two metal components to form an assembly in the form of an enclosure with a joint that may be in an un-welded state or in a welded state; methods of forming a friction stir weld at a joint of an assembly as described; and a welded (post-welded) assembly.

An example assembly can be a hermetically-sealed enclosure of an electronic device, e.g., a hermetically-sealed hard disk drive as primarily described herein. Desirably as a feature of a useful or preferred enclosure or electronic device, an interior of an enclosure can include a low density atmosphere. During preparation of an assembly, an interior of the assembly can be filled with an atmosphere of low density gas to displace air within the interior and to provide a low density (relative to air) atmosphere at the interior of the enclosure. An atmosphere of concentrated helium (e.g., 80, 90, 95 percent helium), for example, is one useful type of low density atmosphere. With the un-welded assembly containing the low density atmosphere, the assembly can be processed by forming a friction stir weld along an entire length of a joint formed between the cover and the base, meaning around the entire perimeter of the assembly. The friction stir weld can be effective to hermetically seal the enclosure, and contain the low density gas inside of the enclosure while preventing other gases at an exterior of the enclosure from entering the enclosure. Example hermetically sealed enclosures that include the friction stir weld can allow for not more than a very low rate of leakage from the enclosure, for example a rate of leakage that is less than 1 percent of a volume of atmosphere (gas) present within the enclosure per year. Examples of hard disk drives that include a base and a cover and that are hermetically sealed to contain a low density atmosphere are described in U.S. Pat. No. 9,536,572, the entirety of which is incorporated herein by reference. See also U.S. Pat. No. 8,279,552, describing a hermetically sealed hard disk.

A base of an enclosure generally includes a space or cavity defined by a horizontal (flat, planar) bottom that includes a perimeter, and by vertically-extending sidewalls that extend from the base, around the entire perimeter of the base, in a vertical direction relative to the horizontal bottom.

Located over the base cavity may optionally be a second "inner" cover along with an inner cover gasket, to provide an interior closure and seal of the base cavity. The inner cover extends over the base cavity and contacts the top surface of the sidewall at the top sidewall perimeter of the base, to cover and enclose the base cavity. The inner cover gasket functions as a seal to prevent movement of gases into or from the enclosed base cavity. The inner cover, which is optional, can be made of any useful material, such as a flat or substantially flat piece of metal with a perimeter that matches the top sidewall perimeter of the base. The inner cover gasket can be made of any useful material, preferably a material that does not substantially interfere with the operation or reliability of internal components contained in an enclosure, including electronic components, a magnetic recording disk, a read-write head, etc. One example of a useful material for an inner cover gasket is a non-silicone-containing thermoplastic form-in-place gasket.

When an inner cover and inner cover gasket are included in a device, a friction stir weld can preferably be placed at a location away from the inner cover gasket. The location of the inner cover and inner cover gasket at the top of the base sidewall may inhibit or prevent placement of a friction stir weld at a location that is also at the top of the sidewall, for example because of the amount of space required for the friction stir weld and for forming the friction stir weld. In addition, local heating of the metal components of the assembly that occurs during a friction stir welding process may require that a friction stir weld be formed away from an inner cover gasket. A useful location can be on the side of the enclosure along a height of the sidewall at a distance from the top of the sidewall. A useful or preferred distance measured vertically from the top surface of the sidewall to the friction stir weld of an assembled and welded enclosure (alternatively, from the top of the sidewall to a joint or a shoulder of a non-welded assembly as described herein) can be at least 2 millimeters, e.g., at least 5 millimeters or up to or at least 10, 12, or 15 millimeters.

The base may be constructed of any useful metal material and may have any general or specific form consistent with the present description. Example base structures may be made of a metal alloy such as an aluminum alloy, for example a 4000 series or 6000 series aluminum alloy. The base structure can be of any useful form, such as being composed of a single integral piece or two or more pieces that are secured (e.g., welded) together. The process for preparing the base may be any, as desired, such as by being forged, extruded, cast, machined, stamped, etc. The materials of the base may be aluminum or an aluminum alloy, but other metals and metal alloys may also be useful.

The base sidewall extends continuously about the entire perimeter of the base and includes an upper sidewall, a lower sidewall, a sidewall top, and a horizontal-extending shoulder that extends horizontally from the sidewall at a location that is vertically between the top and the bottom of the sidewall, along the height of the sidewall. The shoulder extends horizontally from the outer sidewall surface and continuously around the entire perimeter of the base. The horizontal surface of the shoulder connects to the lower portion of the upper sidewall at an interior shoulder corner, and connects to an upper portion of the lower sidewall at an exterior shoulder corner. With the cover and the base in an assembled condition, the shoulder engages a lower end portion of the lip of the cover. At that engagement, the lower end portion of the lip forms a joint with the shoulder that extends continuously around the enclosure at the perimeter of the enclosure. As described herein, a friction-stir weld can be formed at the joint, around the entire perimeter of the assembly, to produce a hermetic seal that extends entirely around the perimeter of the base and the cover.

The sidewall can be any useful or desired height, measured vertically from the bottom of the base to the top surface of the sidewall. A useful or preferred range for a height of a sidewall for a presently-useful hard disk drive device can be in a range from 20 to 30 millimeters, e.g., from 22 to 28 millimeters.

The sidewall has a thickness that extends horizontally from an outer sidewall surface to an inner sidewall surface that defines the base cavity. The thickness of the sidewall can vary along the height of the sidewall, such as by being thicker (having a greater thickness) at a lower portion of the sidewall, and being less thick (having a smaller thickness) at an upper portion of the sidewall. The sidewall top is the uppermost surface of the sidewall, which may typically include a horizontal orientation and have a thickness in a horizontal direction. A thickness at the top and bottom of the sidewall can preferably be at least about 1 millimeter, e.g., at least 2 millimeters. A presently-useful example of a sidewall can have a thickness at a location of formation of a friction stir weld that may be equal to or greater than a thickness at the top of the sidewall, i.e., a greater thickness at a location of the joint, which is the location at which a friction stir weld will be formed. A greater thickness at the location of the friction stir weld will provide a desired level of strength and support during the friction stir weld process. An example of a thickness of the sidewall at a location of a friction stir weld can be at least 1 millimeter, e.g., in a range from 2 or 3 to 5 or 7 millimeters (measured, for example, just above the horizontally-extending shoulder surface). An example of a thickness of the sidewall at a lower (e.g., bottom) location of the sidewall can be at least 2 millimeters, e.g., in a range from 3 or 4 up to about 5, 7, or 8 millimeters (measured, for example, just above the bottom of the base cavity, where the sidewall meets the bottom of the base cavity).

The cover of the enclosure (meaning the exterior or outer cover of a device, as opposed to an optional inner cover as is also described herein) includes a horizontal (flat, planar) top portion and a lip that extends from the perimeter of the horizontal portion in a vertical (downward) direction relative to the horizontal top portion. The cover may be constructed of any useful metal material, and may have any general or specific form consistent with the present description. Example cover structures may be made of aluminum or an aluminum alloy, but other metals and metal alloys may also be useful. The process for preparing the cover may be any, as desired, such as by being forged, extruded, cast, machined, stamped, etc. One particular example of a useful cover can be made of aluminum alloy, for example a 5000 series or 6000 series aluminum alloy, and may be prepared by stamping and by a non-hem (or "zero-hem") method of trimming the lower end of the lip. A zero-hem edge may be formed by known methods and equipment, such as with a cammed cut-off die. Other edge treatments that may or may not produce a zero-hem edge may also be useful.

The cover can be placed over the base with an inner vertical surface of the lip contacting an exterior vertical surface of the sidewall to form a joint between the perimeter of the base sidewall and the perimeter of the lip of the cover. When assembled with the cover placed over the base perimeter, with the cover lip contacting the sidewall, the cover and base form an enclosure that includes an interior that contains the base cavity, which may optionally and preferably be covered by the inner cover and sealed with an inner cover gasket. An additional portion of interior space within the enclosure may be present above the optional inner cover and below the outer cover.

According to the present description, the joint formed between the cover lip and the base sidewall, and other optional features of the base sidewall, can be structured to facilitate effective, efficient, or improved (preferably all three) formation of a friction stir weld at the joint. As determined by Applicant, a shape or dimension of a sidewall, cover lip, or both, can have an effect on the efficiency of methods of forming a friction stir weld at a joint defined by the sidewall and the cover lip, or on the final quality of the friction stir weld that is formed. As described herein, a shape or dimension feature of one or both of a sidewall (e.g., at a shoulder, or at an upper sidewall or at a lower sidewall) or cover lip can be effective to improve the efficient and repeatable preparation of, e.g., in an automated fashion, an enclosure that includes the base and cover. Useful and preferred sidewall and cover lip structures can facilitate a step of placing the cover over the base during assembly (e.g., automated assembly), and a step of producing a hermetic seal about the perimeter of the assembled enclosure in the form of a friction stir weld. One or more features of the base sidewall or cover lip, in addition to facilitating efficient assembly and friction stir weld processing, may also contribute to the quality (e.g., strength) of a friction stir weld that is formed between the cover and the base.

Examples of features of a base sidewall and cover that can contribute to improved assembly efficiency and friction stir weld quality include: the thickness of the cover; the shape and dimensions of features of an outside surface of the sidewall; the shape of the lip of the cover; and the amount of interference at various locations between the base and the cover when assembled.

A thickness of a cover as described, i.e., a thickness in a z-dimension (in a height direction) of the top portion of a cover, alternately a thickness in an x- or y-dimension measured at the lip, may be within a useful range that is sufficiently thick to allow for desired friction stir welding of the cover to the base, without being unnecessarily thick. A preferred cover material may be relatively thin, because a thinner cover material can allow for a larger interior space within an enclosure formed from the cover, meaning a larger space for interior items such as magnetic recording disks. However, a thinner cover material may be more difficult to process by friction stir welding compared to a relatively thicker cover material, because relatively thinner materials are more prone to buckling and tearing. Thus, Applicant has determined that a thickness of a cover can be sufficiently large to allow for friction stir welding as described herein, but held to a low or minimum thickness to allow for a greater amount of interior space of an enclosure that includes the cover. A range of thicknesses that can be useful or preferred is in a range from 10 mils to 40 mils. Preferably, the entire cover, including the vertically-extending lip along the perimeter of the cover, as well as the flat upper portion, has a thickness that is relatively uniform and in a range from 10 mils thick to 40 mils thick. In preferred examples of assemblies as described, a thickness of a horizontal shoulder surface that engages a lip end portion at a joint can also be within this range and can be approximately equal to the thickness of the lip at the lip end portion.

Figure 1B:
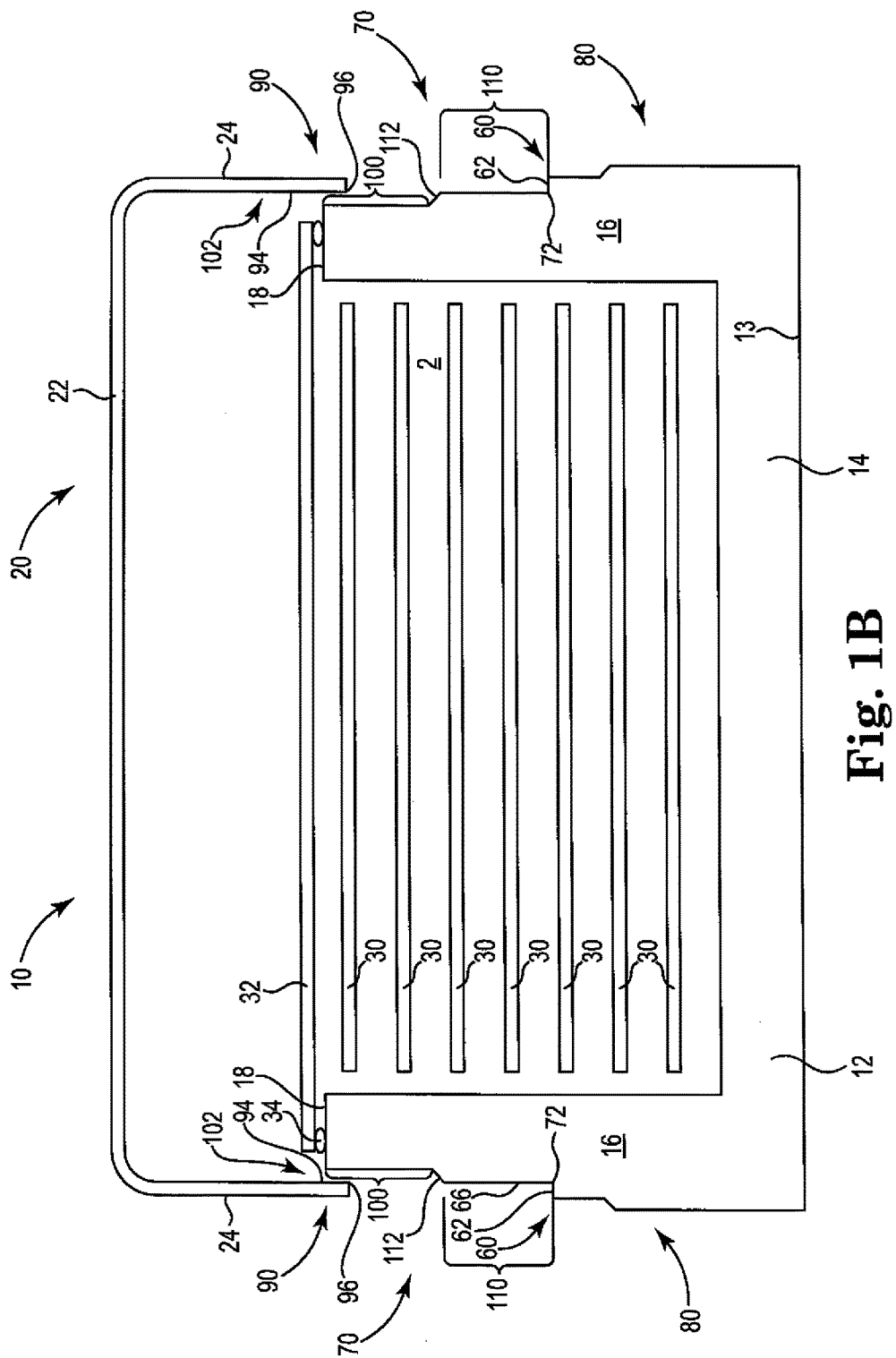

Other useful or preferred features of a base sidewall or cover will be described with reference to FIGS. 1A, 1B, and 1C. These figures show an example electronic device, e.g., hard disk drive 10, that includes base 12, cover 20, optional inner cover 32, and base cavity 2. Base 12 includes a horizontally-extending bottom 14 having a perimeter from which sidewalls 16 extend in an upward (vertical) direction (i.e., at least substantially or approximately vertical with reference to horizontally-extending bottom 14). Cover 20 (i.e., the outer cover) includes horizontally-extending top portion 22 having a perimeter from which lip 24 extends in a downward vertical direction (i.e., at least substantially or approximately vertical with reference to horizontally extending top portion 22).

Within base cavity 2 are located multiple stacked magnetic recording disks 30. Inner cover 32 extends horizontally, contacting top surface 18 of sidewall 16 about the entire perimeter of the sidewall and base, to cover an upper opening of base cavity 2. Inner cover gasket 34 is located at an upper surface (top surface 18) of sidewall 16 to provide a sealed closure of base cavity 2 by inner cover 32.

Referring to FIG. 1, outer sidewall surface 50 includes shoulder 60, upper sidewall 70 (the region above shoulder 60 and below top surface 18 of sidewall 16), and lower sidewall 80 (the region below shoulder 60 and above the bottom of sidewall 16). Shoulder 60 is defined by horizontal shoulder surface 62, a lower portion 64 of upper sidewall 70 that meets horizontal shoulder surface 62 at interior shoulder corner 72, and an upper portion 66 of lower sidewall 80 that meets horizontal shoulder surface 62 at exterior shoulder corner 68. Cover 20 includes vertically-extending lip 24 that includes lower lip end portion 90, lower lip end surface 92, lower lip interior surface 94, and lower lip interior corner 96. In example assemblies of base 12 and cover 20, shoulder surface 62 can be located a distance below top surface 18, measured vertically, e.g., that is at least 2, 3, or 5 millimeters, e.g., at least or up to 7, 10, 12, or 15 millimeters below top surface 18.

An example feature of a base sidewall that can be useful to allow for improved efficiency of assembling a base and a cover is a "lead-in" portion 100 of upper sidewall 70. Lead-in portion 100 is a portion of upper sidewall 70, extending from top surface 18 in a vertical, downward direction, that includes a reduced sidewall thickness that provides for an increased amount of clearance between upper sidewall 70 at lead-in portion 100, and lip 24 including inner surface 94 of lower lip end portion 90, during assembly, i.e., during placement of cover 20 over base 12. Lead-in portion 100 can provide any practical amount of clearance between lead-in portion 100 of upper sidewall 70 and inner surface 94, as may be constrained by size and geometry requirements of other structures of the assembly. An example of a useful amount of clearance, measured as the horizontal distance between a surface of upper sidewall 70 and an adjacent inner surface of cover lip 24, can be at least 0.05 or 0.1 millimeter, e.g., distance in a range from 0.1 to 0.5 millimeters, e.g., from 0.15 to 0.25 or 0.30 millimeters, when cover 20 is placed in an assembled condition over base 12 (see FIG. 1C). The amount of clearance (the distance between the base surface and the cover surface) may be within such a range on all sides of the assembled base and cover. The amount of clearance on each side of the assembled base and cover (e.g., on four sides if the assembly has a square or rectangular-shaped perimeter) may be equal or approximately equal, or may be different. Lead-in portion 100 can have any useful height, such as a height in a range from 1 to 7 millimeters, e.g., from 2 to 6 millimeters, measured from a corner formed at an upper end of lead-in portion 100 and top surface 18, to a corner formed at a lower end of lead-in portion 100 and diagonal transition surface 112.

A next feature of sidewall 16, which corresponds to a feature of inner surface 94 of cover 20, is a feature that provides for a desired amount and force of contact between these structures during formation of a friction stir weld. As shown at FIG. 1B, upper sidewall 70, at a location above and adjacent to horizontal joint surface 62, includes a "zero-draft" portion 110. In an assembled condition, a surface of zero-draft portion 110 fits against inner surface 94 of lower lip end portion 90. These opposed surfaces are referred to herein as "zero-draft" surfaces, meaning that each surface is substantially vertical relative to a horizontal plane defined by a planar bottom surface (13) of base 12, and to a horizontal plane defined by upper portion 22 of cover 20. With these two opposed surfaces being in close opposed contact to facilitate formation of a friction stir weld, the highly-precise vertical orientations of the opposed surfaces provide improved contact between the two opposed surfaces when the surfaces are held together for friction stir welding. The surfaces can be as close to vertical as possible relative to bottom surface 13 of base 12, e.g., at an angle of less than 5 degrees from vertical (e.g., inclined, if at all, toward base cavity 2), or less than 2, 1, or 0.5 degrees from vertical.

An independent but structurally related feature of sidewall 16, at exterior surface 66 of upper sidewall 70 (adjacent to and above horizontal shoulder surface 62), in cooperation with lower lip end portion 90, is a desired tight fit between the opposing and contacting surfaces, i.e., an "interference fit" between these surfaces when assembled to provide close and secure contact between the surfaces during formation of a friction stir weld. The tight fit, referred to herein as an "interference fit," can be a fit that is produced by a light level of interference between surface 94 and surface 66 when cover 20 is placed over base 12 in an assembled condition to form joint 40 (see FIG. 1C). (Note that FIG. 1C, being schematic, shows a space between opposed surfaces 94 and 66. An assembly of a cover and base as described, with interfering surfaces 66 and 94, will not include a space between those surfaces.) A light level of interference can be a level that provides intimate contact between surfaces 94 and 66 and allows for manual or automated placement of cover 20 over base 12 without the need for a high level of force and without causing cracking, tearing, or a more than insignificant level of distortion of cover 20 either at lip 24 or at top portion 22, when cover 20 is placed to cause lower lip end 90 to be fully engaged with (to "bottom out" at) shoulder 60 (e.g., with surface 92 in contact with horizontal shoulder surface 62), which is a desired condition of the assembled cover and base while forming a friction stir weld. The amount of interference may be sufficient to cause difficulty when placing lip end surface 92 in a fully engaged condition with horizontal shoulder surface 62, while not causing the cover to crack or tear.

The amount of interference between cover lip 24 (at surface 94) and sidewall 12 at surface 66 can be as desired and useful to provide assembly and friction stir welding performance as described. An example of an amount of interference between these two structures can be in a range from 1 to 6 mils of interference on all sides of the perimeter, e.g., from 2 to 5 mils of interference on all sides of the perimeter. The amount of interference may be substantially equal and within such a range on all (e.g., four) lengthwise side portions of a joint of assembled base and cover, e.g., on four sides of a square or rectangular assembly. However, interference between cover lip 24 and sidewall 12 at corners of an assembly (e.g., each of four corners of a square or rectangular assembly), where the cover lip meets the base shoulder corner, is not preferred. Minimizing the air gap at the joint in corner areas of a perimeter is desired, as opposed to creating an interfering fit. To minimize an air gap, the radii of corner 96 and 72 may be made to match, e.g., with both corners having the same small radius of curvature, or by a joint that includes a radius of a base corner 72 that is smaller than the radius of cover corner 96 (to avoid an interference).

The location of the interfering structures in a vertical direction along surface 66, i.e., the height of the interfering structures in a vertical direction, can be sufficient to provide assembly and friction stir welding performance as described. An example of a useful height of interfering surfaces 66 and 94 can be in a range from 1 to 7 millimeters, e.g., from 2 to 6 millimeters.

As another optional feature, the opposed surfaces that form joint 40, including the surfaces of shoulder 60 and lower lip end portion 90, may additionally be prepared to include interference at interior shoulder corner 72. In specific, at joint 40, corner 72 abuts and contacts corner 96 formed between surface 94 and end surface 92 of lower lip end portion 90. A joint as described herein can include a light level of interference between these two opposed corner structures. A light amount of interference between the cover corner and the base corner structures (at non-corner segments (straight segments) of a perimeter) can allow for a desired amount of light interference between surfaces 66 and 94, described hereinabove. A non-interference fit at corners of a perimeter can be preferred, e.g., to allow for ease of cover installation.

Interference between the two opposed structures of a cover corner 96 and a base corner 72, along the perimeter, can be created by making a radius of curvature of corner 96 larger than a radius of curvature of corner 72. An example of a radius of curvature of corner 96 can be less than 15 mils, e.g., less than 10 mils, or less than 6 or 3 mils. An example of a radius of curvature of corner 72 can be less than 15 mils, e.g., less than 10 mils, or less than 6 or 3 mils, with the radius of curvature of corner 96 preferably being at least slightly greater than the radius of curvature of corner 72, such as a radius of curvature of corner 96 that is up to or about 5, 20, 30, or 40 percent greater than the radius of curvature of corner 72.

Figure 1C:
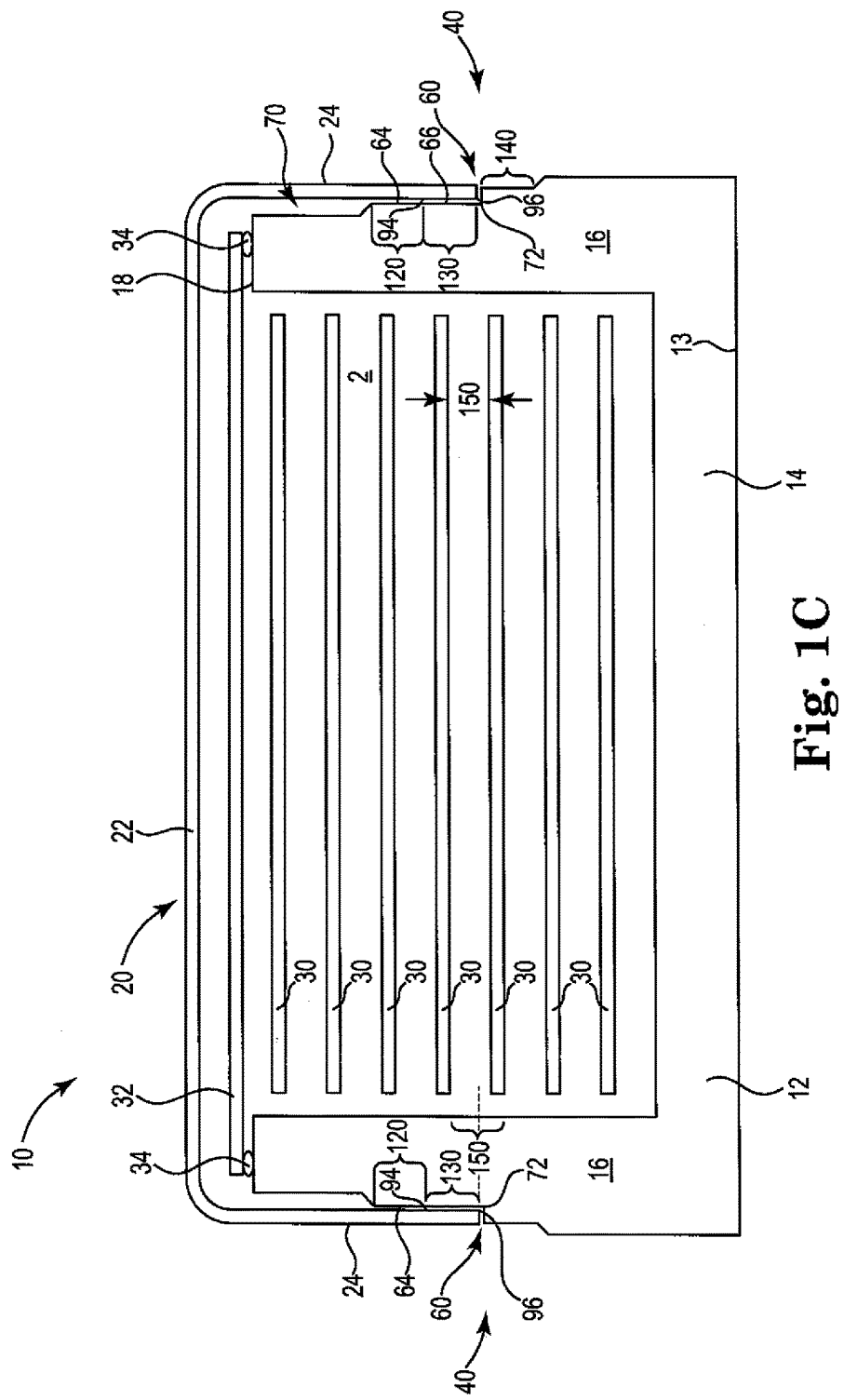

Also shown at FIG. 1C are certain specific portions of the assembled structure that include contact between upper sidewall 70 and surface 94 of cover 20. Portion 130 is an area of contact of upper sidewall 70 with surface 94, at a location adjacent to shoulder 60, joint 40, and the location of formation of a friction stir weld. This area, which may be referred to as a "weld support area," provides supportive backing of lower lip end portion 90 against the outer surface of sidewall 16 to support a downforce (i.e., a force in the horizontal direction, pressuring lower lip end portion 90 toward sidewall 16) that is placed against lower lip end portion 90 during a friction stir welding process.

Adjacent to and above portion 130 is an extended region of contact between upper sidewall 70 and surface 94, i.e., region 120. Region 120, which is adjacent to and above weld support area 130, is an extended region of contact of sidewall 70 with surface 94, and can be used as a "clamp area" or an extended clamp area. During a friction stir weld step, with cover 20 being in an assembled condition over base 12 (e.g., as shown in FIG. 1C), a clamp or other constraint can be used to hold cover 20 over base 12 in an assembled condition. The clamp or other constraint can be located at clamp area 120, which is a sufficient distance from joint 40 to allow placement of the clamp or constraint to support the assembly without the clamp or constraint interfering with the process of forming the friction stir weld.

A total vertical size, i.e., height, of the combined weld support area 130 and clamp area 120 can be as desired and may be the same or different from the size (height) of the interference fit between lower lip end portion 90 and sidewall 16. Examples of a useful combined height of weld support area 130 and clamp area 120 can be in a range from 1 to 7 millimeters, e.g., from 2 to 6 millimeters.

Adjacent to and below shoulder 60, at an upper portion of lower sidewall 80, sidewall 16 can optionally and preferably include clean surface area 140, which is an area of bare metal base material immediately below joint 40 at the outer surface of sidewall 16 about the entire perimeter of base 12. Also, the lower portion of upper sidewall 70 (e.g., all or the lower portion of the surface of zero draft portion 110) can include a bare metal surface, as can horizontal shoulder surface 62. A bare metal surface is free of any surface coating such as plating (e.g., a nickel plating or E-coat), or any other surface material or treatment. Bare metal base material surfaces at area 140, at the lower portion of upper sidewall 70 (adjacent to horizontal shoulder surface 62), and at horizontal shoulder surface 62, prevents materials other than metal material of base 12 from being present at a location of formation of a friction stir weld, e.g., at joint 40. Any material other than the material of base 12 that would be present at a surface that is used to form a friction stir weld could become incorporated into the material of the weld, and the presence of that material may potentially reduce the quality of the weld. A vertical size, i.e., height, of clean surface area 140, and of a clean surface of the lower portion of upper sidewall 70, can be as desired and sufficient to allow formation of a friction stir weld, so that the weld does not contain any materials other than the material of base 12 and cover 20. Examples of useful heights of clean surface area 140, and of a clean surface of the lower portion of upper sidewall 70, measured to extend vertically along sidewall 16 from horizontal joint surface 62, can be at least about 0.5 millimeters, e.g., in a range from 0.5 to 3 millimeters.

As yet another optional and useful feature of an assembly as shown at FIG. 1C as an exemplary hard disk drive, a vertical location of joint 40, and a friction stir weld produced from joint 40, may be selected to avoid (i.e., differ from) a vertical location of a disk 30 within base cavity 2. A preferred height-wise location of joint 40 (e.g., a height-wise location of horizontal shoulder surface 62) and a friction stir weld formed at joint 40, can be a height that aligns with a space present between two adjacent disks 30, as shown by region 150. Placing joint 40 and a weld formed from joint 40 at a vertical location (height) that is horizontally aligned with a space between two disks 30, and that is not horizontally aligned with a location of a disk 30, can reduce or prevent the possibility of heat that is produced during a friction stir weld step from detrimentally affecting the structure or performance of a disk 30.

A joint as described can be processed by a step of friction stir welding to produce a weld along the length of the joint, e.g., around the entire perimeter of the cover at the joint, preferably to produce a hermetic seal. Friction stir welding of the components of a joint as described can be performed by rotating a friction stir welding tool and contacting the rotating tool to the joint. The rotating tool generates heat at the joint to soften and cause flow of the metal material of the lip end and the base at the shoulder (and the joint). Specifically, the rotating tool heats and mechanically mixes and joins the base and the lip, at the joint, using mechanical pressure to soften portions of material of the lip and of the base in contact with and adjacent to the tool, and blends the portions of material from the lip and the base, which subsequently cool to form the finished weld. In preferred examples, a depth of the friction stir weld is at least as deep as the thickness of the lip end, preferably at least 5 or 10 percent greater than the thickness of the lip end.

Figure 2:
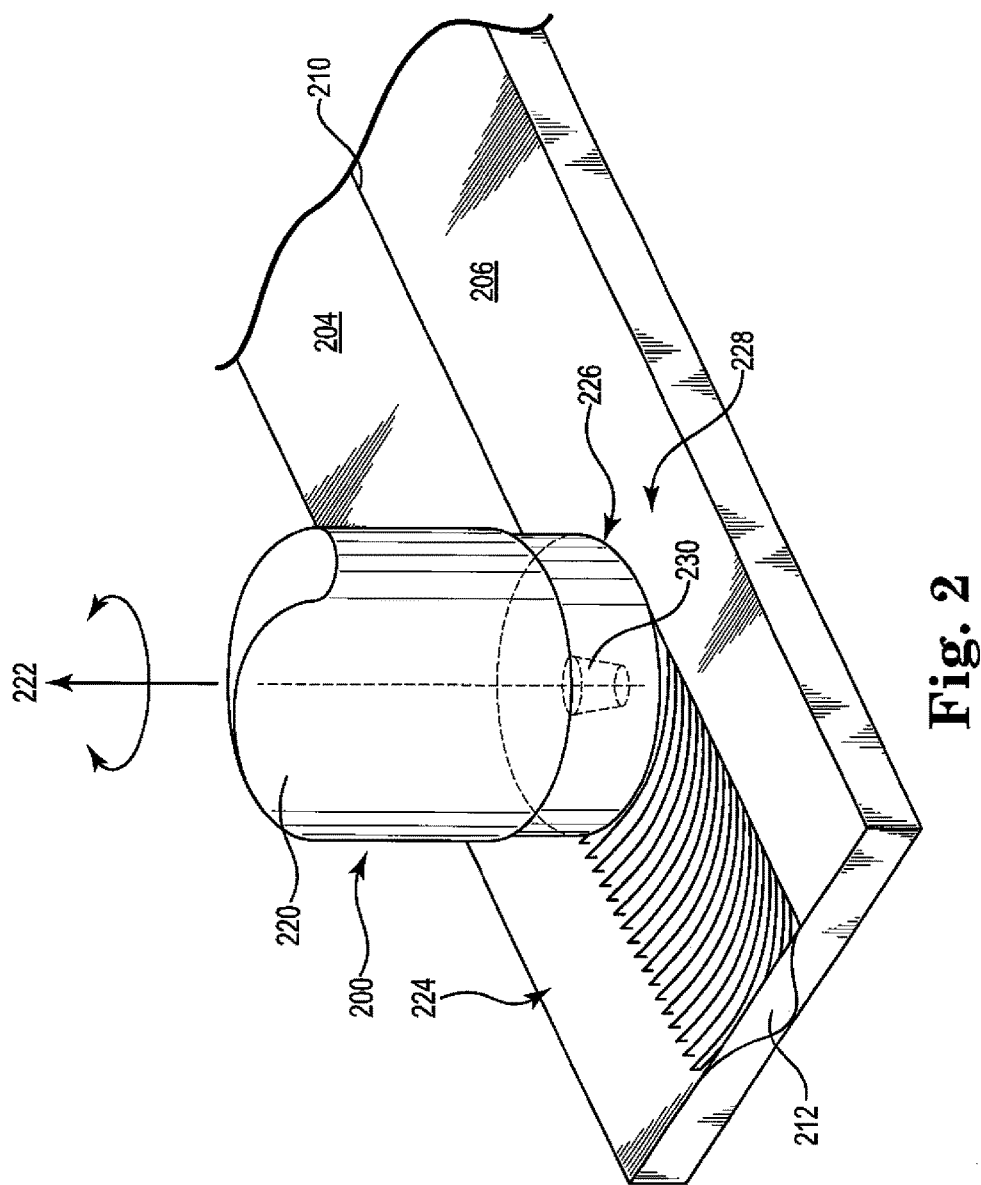
FIG. 2 shows a step of friction stir welding a workpiece, as described.

Referring to FIG. 2, a method of friction stir welding a joint as described can be performed by providing a tool 200 for forming a friction stir weld and rotating the tool, while applying pressure at joint 210, to form a friction stir weld 212. A first metal component 204, e.g., a base, and a second metal component 206, e.g., a cover, meet at adjacent edges to form joint 210, e.g., as described herein. Tool 200 includes support body 220 having longitudinal axis 222 and distal end 224. Shoulder 226 at distal end 224 includes distal face 228 (held against a top surface of joint 210) adapted to contact surfaces of components 204 and 206 at joint 210 during friction stir welding. Distal face 228 is centered on axis 222 and extends laterally to a perimeter at shoulder 226 centered on the axis. Extending in a distal direction from distal face 228, along axis 222, is pin 230, which extends into first and second metal components 204 and 206 at joint 210 during friction stir welding During formation of a friction stir weld (212) along a length of a joint 210, distal face 228 of tool 200 is placed in contact with surfaces of components 204 and 206 at joint 210. Pressure from tool 200 is applied to joint 210 as tool 200 is rotated to soften (without melting) materials of metal components 204 and 206. As tool 200 moves along joint 210, friction stir weld 212 is formed.

Parameters of a useful step of forming a friction stir weld can be any that are useful to produce a desired friction stir weld. Examples of parameters that can be selected and controlled include rotation speed of the tool, downforce of the tool against the workpiece, speed of the tool along the length of the joint (i.e., speed of forming the weld in a length-wise direction, also referred to as translational speed), an angle of the tool relative to the workpiece (e.g., from 1 to 10 degrees), as well as dimensions of the tool itself such as the diameter of the tool at the shoulder (distal face) and the diameter the length of the pin (pin length being measured along the axis of the tool from the distal face).

A diameter of the tool at the shoulder (i.e., a maximum diameter at the distal face) can approximate a width of a friction stir weld that is formed. Any diameter can be used that will provide a weld that has sufficient strength, and that will be useful for efficiently preparing a friction stir weld as described. Examples of diameters of a tool at the shoulder, and corresponding widths of a friction stir weld, may be less than about 10 millimeters, e.g., in a range from 1 to 8 millimeters, such as from 2 to 4 millimeters, or from 3 to 5 millimeters.

A depth of a friction stir weld will typically be slightly greater than a length of a pin extending from the distal face of a tool used to form the weld. A desired depth of a weld as described herein is at least as deep as, preferably deeper than, the thickness of the lip end and the width of the shoulder at a joint at which the weld is formed (see, e.g., FIG. 1C and related text). To form a weld of this depth, the length of the pin should be at least as long as the thickness of the lip (at the joint) and at least as long as the width of the shoulder (e.g., a width of horizontal shoulder surface 62), preferably at least 5, 10, 20, or 30 percent greater than one or both of those dimensions. According to certain embodiments of tools and friction stir weld methods, a length of a pin can be in a range from 0.2 to 1.5 millimeters. A diameter of the pin, measured at a base of the pin located at a connection of the pin to the distal face, can be any useful diameter, such as a diameter in a range from 0.5 to 1.5 millimeters.

During formation of the weld, the tool can be rotated at a speed that is useful to add sufficient energy to the two metal components of a joint to soften the metal components and allow mixing of the metal components by the tool. Useful and preferred rotational speeds of a tool to form a friction stir weld as described can be at least 1,000 revolutions per minute (rpm), e.g., at least 2,000 rpm, or at least 6,000, 8,000, or 12,000 rpm, and up to about 30,000 rpm.

During formation of the weld, the tool, i.e., at the distal face, can apply a downforce to the two metal components at the joint in a direction along the axis of the tool. Any amount of downforce can be used that will be effective in forming a desired weld in an efficient manner. Examples of a useful downforce may be less than about 1,000 newtons, e.g., less than 500 newtons.

During formation of the weld a tool may be moved along a joint in a lengthwise direction at any useful speed, preferably a speed that will efficiently form a high quality weld. Examples of useful speeds of a tool along a joint during formation of a friction stir weld can be in a range from about 0.1 to 3 meters per minute (e.g., from about 1.6 to 50 millimeters per second).

Figure 3:
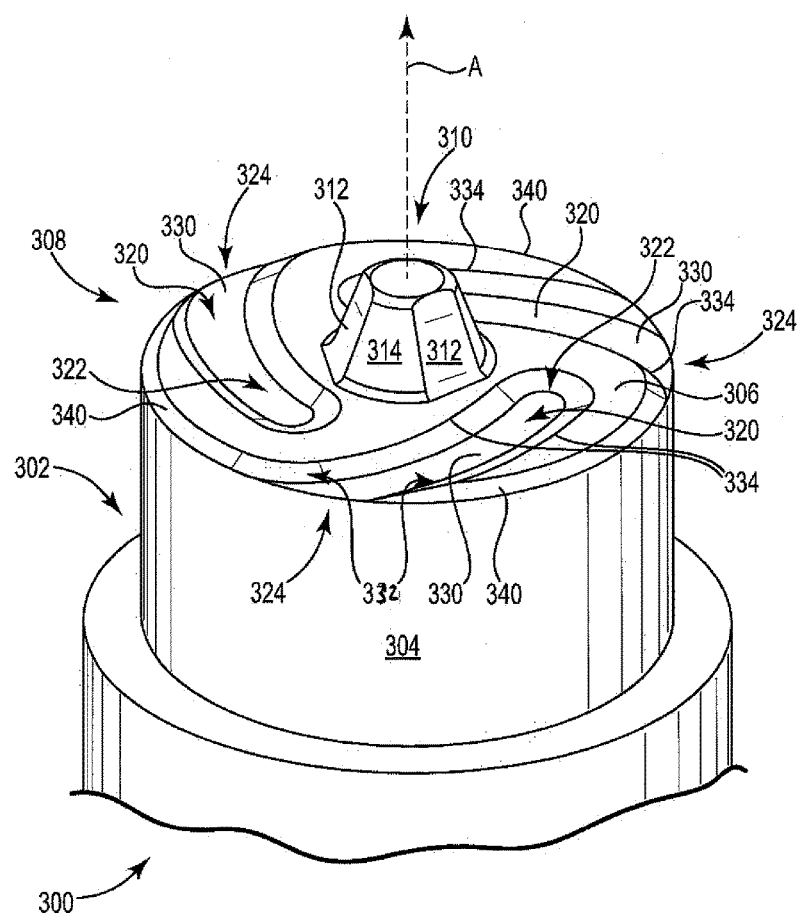
FIG. 3 shows an example of a friction stir weld tool useful in a method as described.

An example of a useful tool is shown at FIG. 3. As illustrated, tool 300 includes support body 302 that has a longitudinal axis (A), outer surface 304 centered on the axis, and distal face 306 centered on the axis and extending from the axis laterally to perimeter 308 of distal face 306 and support body 302. Pin 310 extends from distal face 306 in a direction along the axis and distally from distal face 306.

Distal face 306, exemplary, as illustrated, includes a scroll pattern that includes at least two arcuate (when viewed in a direction of axis A) grooves 320 formed in distal face 306. Each groove 320 extends from a groove start location 322 located between the axis and perimeter 308, to a groove end segment 324 at perimeter 308. A depth of each groove in distal face 306 may be shaped as desired, with useful or preferred grooves having a maximum depth in a range from 0.05 to 0.5 millimeters relative to the surface of distal face 306. Preferred grooves can have a shape (when viewed in cross section in a plane that includes the axis) that includes a bottom 330 (at a maximum depth of the groove) and sidewalls 332 that extend from bottom 330 to opposed distal (e.g., upper) edges 334 of each groove 320, where each groove 320 meets distal face 306 at a cornered edge. The shape of preferred grooves can include sidewalls 332 that are curved or angled (e.g., chamfered) relative to the direction of axis A, i.e., not parallel to axis A. In cross section, a useful or preferred sidewall can have a surface that is considered to extend along a line that is non-parallel to the axis, for example along a line that forms an angle with the axis that is in a range from 30 to 60 degrees. Curved or chamfered sidewalls 332 differ from sidewalls that are vertical, meaning sidewalls that extend in a direction that is parallel to axis A.

As illustrated, tool 300 includes three chamfered shoulder segments 340 that extend along perimeter 308 between three groove end segments 324. Each chamfered shoulder segment 340 extends along perimeter 308 between two adjacent groove end segments 324. Each chamfered shoulder segment 340 includes a surface that connects and extends between distal face 306 and a distal end of outer surface 304 of support body 302, with each surface extending in a direction that includes a directional component that is the parallel with the axis. In cross section in a plane of the axis, each chamfered shoulder segment surface can be considered to extend along a line that is non-parallel to the axis, for example along a line that forms an angle with the axis that is in a range from 30 to 60 degrees.

Pin 310 can have any structure, shape, or form that will provide desired performance of tool 300 when used for friction stir welding. Useful and preferred examples of shapes of pin 310 can include multiple outer surfaces (e.g., sidewalls) that include three or more facets 312, which are flat or planar surfaces that can preferably be oriented to be non-parallel to axis A. Facets 312 may be connected to adjacent facets or may optionally be interrupted by rounded portions 314 (as illustrated at FIG. 3). The number of facets on a pin can be as desired and useful, e.g., at least 3, and up to 5, 6, 8, or more. Distal pin end (the portion of pin 310 that is farthest away from distal face 306) of pin 310 can be flat and planar, i.e., perpendicular relative to axis A or may be cornered, angular, or substantially sharp, e.g., if formed by an intersection of facets 312.

Specific dimensions of a tool as described can be any that are useful for forming a friction stir weld. Useful sizes of a support body (e.g., diameter at a distal face), grooves, and a pin of a tool can be comparable to tools that have previously been useful for forming friction stir welds. According to certain embodiments of tools of the present description, however, a tool may have relatively smaller features sizes, which may allow a tool to be useful to form friction stir welds with potentially advantageous operating parameters, for example by use of a relatively higher tool rotational speed (rpm), relatively higher translational speed, a reduced downforce, or two or more of these.

In additional detail, useful dimensions of a support body and pin may be ones that are capable of being used to form a desired friction stir weld, with dimensions of any particular tool being selected based on factors that include the type and dimensions (e.g., thickness) of a workpiece, the desired size dimensions (width and depth) of a friction stir weld that is being formed, and desired or preferred operating parameters such as rotational speed (rpm), translational speed, and downforce. For a tool that is capable of preferred uses that include forming a friction stir weld from a relatively thin workpiece, or for use in a friction stir welding process that includes one or more of a relatively high rotational speed (rpm), relatively high translational speed, or relatively low downforce, certain relatively smaller dimensions can be preferred, such as a relatively small diameter of the support body, a relatively short length of a pin, and a relatively small diameter of the pin. According to such embodiments, a diameter of a support body at or near a shoulder may be less than about 10 millimeters, e.g., in a range from 2 to 10 millimeters, such as from 3 to 4 or 3 to 5 millimeters. Also according to these embodiments, a length of the pin may be a length that is sufficient to form a weld of a desired depth; when working with a relatively thin workpiece, a length of an example pin may be in a range from 0.2 to 1.5 millimeters, e.g., from 0.2 to 0.6 or 0.8 millimeters. A diameter of the pin for such embodiments, measured at a base of the pin located at a connection of the pin to the distal face, may be in a range from 0.5 to 1.5 millimeters.

The invention claimed is:

1. An enclosure comprising:
   a metal base comprising:
      a horizontal bottom and a base cavity defined by the bottom and vertical base sidewalls at a base perimeter,
      an outer sidewall surface extending along the base perimeter that includes a shoulder, an upper sidewall surface above the shoulder, and a lower sidewall surface below the shoulder, the shoulder comprising a lower portion of the upper sidewall surface connecting to a horizontal shoulder surface at an interior shoulder corner, the horizontal shoulder surface extending horizontally from the interior shoulder corner to an exterior shoulder corner, and an upper portion of the lower sidewall surface extending vertically from the exterior shoulder corner;

a cover located over the base to enclose the base cavity, the cover including a horizontal top portion extending over the base and a lip at a cover perimeter, the lip extending in a vertical direction relative to the horizontal top portion, the lip including a lower lip portion that contacts the shoulder when the cover is installed over the base; and an interference fit between the lower lip portion and the lower portion of the upper sidewall surface, wherein a radius of curvature of an inner corner of an end of the lip portion is larger than a radius of curvature of the interior shoulder corner.

2. An enclosure of claim 1 wherein the lower lip portion has a thickness in a range from 10 to 40 mils.

3. An enclosure of claim 1 wherein the interference fit includes from 1 to 6 mils of interference on each of four sides of the perimeter.

4. An enclosure of claim 1 wherein the interference fit extends around the cover perimeter and has a height of at least 1 millimeter.

5. An enclosure of claim 1 comprising a reduced base thickness at a top of the sidewall to provide clearance between the top of the sidewall and an interior surface of the cover.

6. An enclosure of claim 5 wherein the clearance is horizontal spacing between the sidewall surface and the interior surface of the cover, in a range from 0.1 to 0.3 millimeters.

7. An enclosure of claim 6 wherein the clearance extends around the cover perimeter, and has a height of at least 1 millimeter.

8. An enclosure of claim 1 wherein the shoulder is at least 2 millimeters below a top of the sidewall.

9. An enclosure of claim 1 wherein the upper sidewall surface includes a weld support area and a clamp area.

10. An enclosure of claim 1 wherein an angle between a vertical sidewall surface at the lower portion of the upper sidewall surface adjacent to the horizontal shoulder surface, and a bottom surface of the base, is less than 2 degrees.

11. An enclosure of claim 1 wherein an angle between an inner surface of the lower lip portion, and a bottom surface of the base, is less than 2 degrees.

12. An enclosure of claim 1 wherein the upper portion of the lower sidewall includes a bare metal surface, and the lower portion of the upper sidewall surface includes a bare metal surface.

13. An enclosure of claim 1 wherein the enclosure contains a stack of magnetic recording disks having axes aligned perpendicular to the bottom, the disks being positioned vertically with spaces between adjacent disks, and wherein the horizontal shoulder surface is aligned horizontally with one of the spaces.

14. An enclosure of claim 1 comprising a friction stir weld formed at the shoulder around the perimeter.

15. An enclosure of claim 14 comprising a low density interior atmosphere.

16. An enclosure comprising:
a metal base comprising:
a horizontal bottom and a base cavity defined by the bottom and vertical base sidewalls at a base perimeter,
an outer sidewall surface extending along the base perimeter that includes a shoulder, an upper sidewall surface above the shoulder, and a lower sidewall surface below the shoulder, the shoulder comprising a lower portion of the upper sidewall surface connecting to a horizontal shoulder surface at an interior shoulder corner, the horizontal shoulder surface extending horizontally from the interior shoulder corner to an exterior shoulder corner, and an upper portion of the lower sidewall surface extending vertically from the exterior shoulder corner;

a cover located over the base to enclose the base cavity, the cover including a horizontal top portion extending over the base and a lip at a cover perimeter, the lip extending in a vertical direction relative to the horizontal top portion, the lip including a lower lip portion that contacts the shoulder when the cover is installed over the base; and an interference fit between the lower lip portion and the lower portion of the upper sidewall surface, wherein the enclosure contains a stack of magnetic recording disks having axes aligned perpendicular to the bottom, the disks being positioned vertically with spaces between adjacent disks, and wherein the horizontal shoulder surface is aligned horizontally with one of the spaces.

17. An enclosure of claim 16 wherein the lower lip portion has a thickness in a range from 10 to 40 mils.

18. An enclosure of claim 16 wherein the interference fit includes from 1 to 6 mils of interference on each of four sides of the perimeter.

19. An enclosure of claim 16 wherein the interference fit extends around the cover perimeter and has a height of at least 1 millimeter.

* * * * *